(12) United States Patent
Matsushita et al.

(10) Patent No.: US 10,535,972 B2
(45) Date of Patent: Jan. 14, 2020

(54) ELECTRONIC COMPONENT PACKAGE AND ELECTRONIC COMPONENT DEVICE

(71) Applicants: SHINKO ELECTRIC INDUSTRIES CO., LTD, Nagano-shi, Nagano (JP); NICHIA CORPORATION, Anan-shi, Tokushima (JP)

(72) Inventors: Shigeru Matsushita, Nagano (JP); Mikio Suyama, Nagano (JP); Eiichiro Okahisa, Anan (JP); Kazuma Kozuru, Anan (JP)

(73) Assignees: SHINKO ELECTRIC INDUSTRIES CO., LTD., Nagano-Shi (JP); NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 16/055,416

(22) Filed: Aug. 6, 2018

(65) Prior Publication Data

US 2019/0052042 A1 Feb. 14, 2019

(30) Foreign Application Priority Data

Aug. 9, 2017 (JP) ................................. 2017-153975

(51) Int. Cl.
*H01S 3/02* (2006.01)
*H05K 5/04* (2006.01)
(Continued)

(52) U.S. Cl.
CPC .................. *H01S 3/02* (2013.01); *H05K 5/04* (2013.01); *H05K 5/06* (2013.01); *H05K 5/0239* (2013.01)

(58) Field of Classification Search
CPC ... H01L 25/0753; H01L 33/486; H01L 33/60; H01L 33/62; H01S 3/02; H01S 5/022;
(Continued)

(56) References Cited

U.S. PATENT DOCUMENTS

2006/0139903 A1* 6/2006 Takagi .................. H01L 23/047
361/764
2006/0180909 A1* 8/2006 Kim ........................ H01L 23/10
257/680
(Continued)

FOREIGN PATENT DOCUMENTS

JP 04179254 A * 6/1992 ............. H01L 23/06
JP 8-097320 4/1996
(Continued)

*Primary Examiner* — Timothy J Thompson
*Assistant Examiner* — Guillermo J Egoavil
(74) *Attorney, Agent, or Firm* — Rankin, Hill & Clark LLP

(57) ABSTRACT

An electronic component package includes: a metal plate; a metal wall that is disposed on the metal plate; a metal frame that is disposed on the metal plate so as to be opposed to the metal wall; a through hole that is formed in the metal wall; an opening hole that is formed in the metal frame so as to be opposed to the through hole; and a lead that is hermetically sealed with a sealing portion provided in the through hole, and that is inserted into the opening hole and the through hole. The metal frame includes: a side plate that is opposed to the metal wall; a bent portion that is connected to the side plate and has a round shape; and a welding portion that is connected to the bent portion and to which a lid member is to be bonded.

7 Claims, 17 Drawing Sheets

(51) Int. Cl.
*H05K 5/06* (2006.01)
*H05K 5/02* (2006.01)

(58) Field of Classification Search
CPC ............ H01S 5/02216; H01S 5/02256; H01S 5/02272; H01S 5/02276; H01S 5/02292; H01S 5/02469; H01S 5/3013; H01S 5/4025; H05K 5/04; H05K 5/06; H05K 5/0239
USPC .................................... 174/500; 372/44.01
See application file for complete search history.

(56) References Cited

U.S. PATENT DOCUMENTS

| | | | |
|---|---|---|---|
| 2011/0044593 A1* | 2/2011 | Kihara | G02B 6/4201 385/93 |
| 2013/0075596 A1* | 3/2013 | Matsuno | G02B 26/001 250/226 |
| 2013/0272329 A1* | 10/2013 | Auen | H01S 5/024 372/34 |
| 2014/0008780 A1* | 1/2014 | Tsujino | H01L 23/057 257/690 |
| 2017/0338628 A1* | 11/2017 | Matsushita | H01S 5/02216 |
| 2018/0254604 A1* | 9/2018 | Matsushita | H01S 5/02216 |

FOREIGN PATENT DOCUMENTS

| | | |
|---|---|---|
| JP | 2003-258139 | 9/2003 |
| JP | 2005-101376 | 4/2005 |
| JP | 2007-266171 | 10/2007 |

* cited by examiner (X1-X1)

(X2-X2)

ELECTRONIC COMPONENT PACKAGE AND ELECTRONIC COMPONENT DEVICE

This application claims priority from Japanese Patent Application No. 2017-153975 filed on Aug. 9, 2017, the entire contents of which are herein incorporated by reference.

BACKGROUND

1. Technical Field

Embodiments of the present disclosure generally relate to an electronic component package and an electronic component device.

2. Background Art

In the background art, there are electronic component packages on each of which an electronic component such as a light-emitting element can be mounted and airtightly sealed. In such an electronic component package, first, a metal frame is disposed on a metal plate and an electronic component is mounted in a mounting portion inside the metal frame. Then, a lid member is welded on the metal frame.

Leads extending from the outside toward the mounting portion are provided to be inserted through side plates of the metal frame. The electronic component is connected with the leads by metal wires (see e.g., JP-A-H8-97320, JP-A-2003-258139, JP-A-2005-101376, and JP-A-2007-266171).

As will be described in an undermentioned preliminary matter, in an electronic component package, an electronic component is first mounted in a region inside a metal frame, and a lid member is then bonded to the metal frame by seam welding. Leads are hermetically sealed with glass sealing portions in through holes of the metal frame.

In the seam welding, roller electrodes are used to perform welding on the lid member while pressing down the lid member. For this reason, the glass sealing portions provided in the metal frame might be broken to thereby impair airtightness.

In addition, the metal frame is formed as follows. That is, a metal tube made of a drawn material is cut off to thereby obtain a frame member. Then, the frame member is additionally machined so that through holes for glass sealing are formed in the frame member by cutting. Thus, the manufacturing of the frame member may increase the cost.

SUMMARY

Certain embodiments provide an electronic component package. The electronic component package comprises: a metal plate; a metal wall that is disposed on the metal plate; a metal frame that is disposed on the metal plate so as to be opposed to the metal wall; a through hole that is formed in the metal wall; an opening hole that is formed in the metal frame so as to be opposed to the through hole; and a lead that is hermetically sealed with a sealing portion provided in the through hole, and that is inserted into the opening hole and the through hole. The metal frame includes: a side plate that is opposed to the metal wall; a bent portion that is connected to the side plate and has a round shape; and a welding portion that is connected to the bent portion and to which a lid member is to be bonded.

Certain embodiments provide an electronic component package. The electronic component package comprises: a metal plate; a ceramic member that is disposed on the metal plate; an electrode that is formed on the ceramic member; a ceramic spacer that is formed on the electrode; and a metal frame that is disposed on the ceramic spacer. The metal frame includes: a side plate; a bent portion that is connected to the side plate and has a round shape; and a welding portion that is connected to the bent portion and to which a lid member is to be bonded.

Certain embodiments provide an electronic component device. The electronic component device comprises: an electronic component; an electronic component package that is configured to mount the electronic component thereon; and a lid member that is bonded to the electronic component package. The electronic component package comprises: a metal plate on which the electronic component is disposed; a metal wall that is disposed on the metal plate; a metal frame that is disposed on the metal plate so as to be opposed to the metal wall; a through hole that is formed in the metal wall; an opening hole that is formed in the metal frame so as to be opposed to the through hole; and a lead that is hermetically sealed with a sealing portion provided in the through hole, and that is inserted into the opening hole and the through hole. The metal frame includes: a side plate that is opposed to the metal wall; a bent portion that is connected to the side plate and has a round shape; and a welding portion that is connected to the bent portion and to which the lid member is bonded.

Certain embodiments provide an electronic component device. The electronic component device comprises: an electronic component; an electronic component package that is configured to mount the electronic component thereon; and a lid member that is bonded to the electronic component package. The electronic component package comprises: a metal plate on which the electronic component is disposed; a ceramic member that is disposed on the metal plate; an electrode that is formed on the ceramic member; a ceramic spacer that is formed on the electrode; and a metal frame that is disposed on the ceramic spacer. The metal frame includes: a side plate; a bent portion that is connected to the side plate and has a round shape; and a welding portion that is connected to the bent portion and to which the lid member is bonded.

DETAILED DESCRIPTION

Embodiments will be described below with reference to the accompanying drawings.

A preliminary matter underlying the embodiments will be described prior to description of the embodiments.

FIGS. 1A to 1C, FIGS. 2A to 2C, FIGS. 3A and 3B and FIGS. 4A and 4B are views for explaining an electronic component package according to the preliminary matter. Description of the preliminary matter is about the details of personal study of the present inventor, that contain techniques not belonging to known techniques.

Figure 1A:
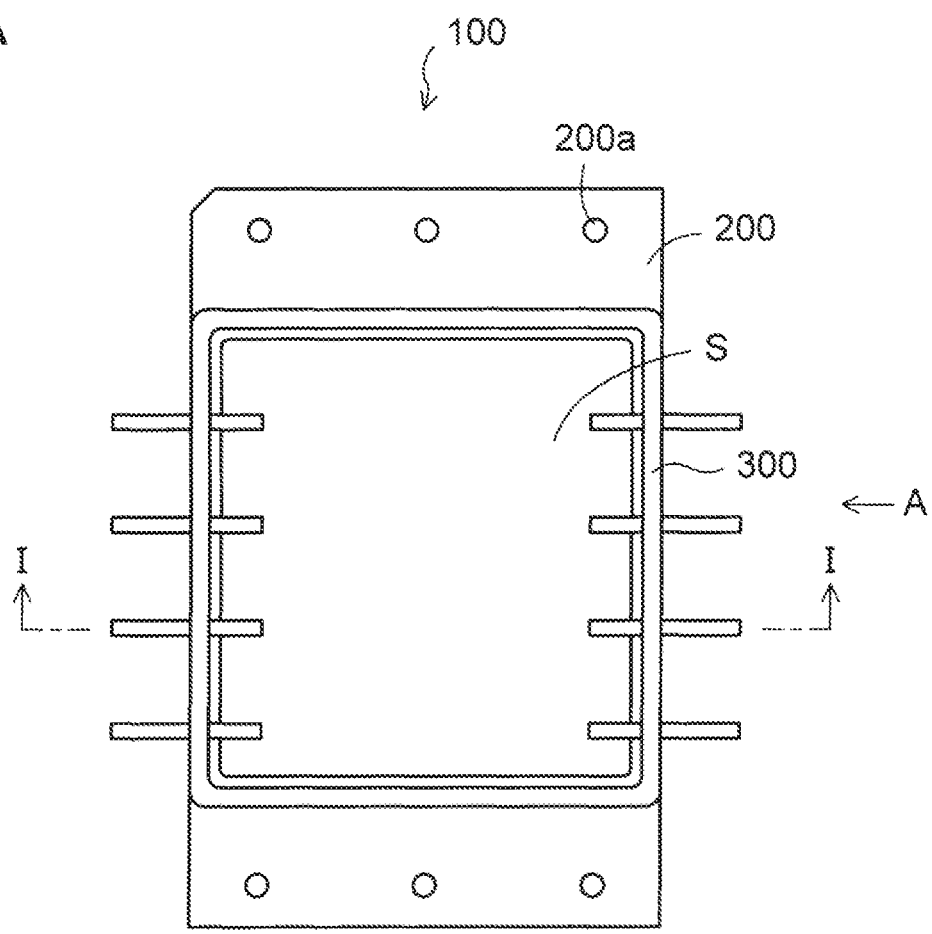
FIGS. 1A to 1C are a plan view, a sectional view and a side view showing a first electronic component package according to a preliminary matter.
Figure 1B:
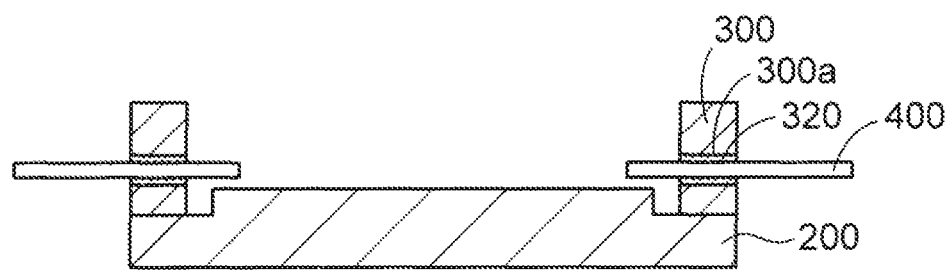
Figure 1C:
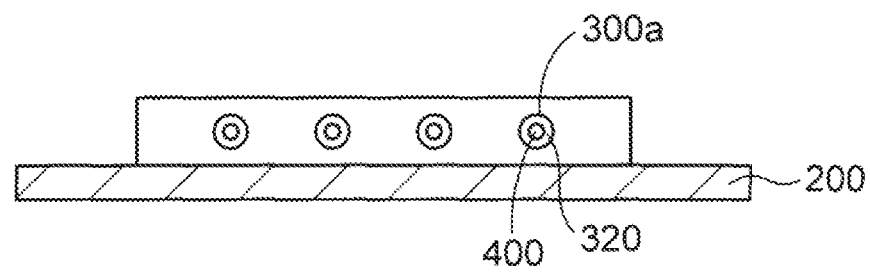

FIG. 1A is a plan view showing a first electronic component package according to the preliminary matter. FIG. 1B is a sectional view taken along a line I-I of FIG. 1A. FIG. 1C is a side view seen from an arrow direction A of FIG. 1A.

In the first electronic component package 100 according to the preliminary matter, as shown in FIGS. 1A and 1B, a metal frame 300 is brazed on a central portion of a metal plate 200 that is shaped like a rectangle. The metal plate 200 is formed out of copper (Cu). The metal frame 300 is formed out of iron (Fe). A region inside the metal frame 300 serves as a mounting portion S in which an electronic component can be mounted.

Screw holes 200a into which screws can be fastened are provided in each of lengthwise opposite end portions of the metal plate 200. The metal frame 300 is a tubular frame member in which straight-shaped side plates are erectly provided on four sides.

In addition, as shown in FIGS. 1B and 1C, through holes 300a are disposed in each of widthwise opposite side plates of the metal frame 300 to be lined up sideways. Further, leads 400 are hermetically sealed with glass sealing portions 320 (an example of a sealing portion) in the through holes 300a of the metal frame 300.

Figure 2A:
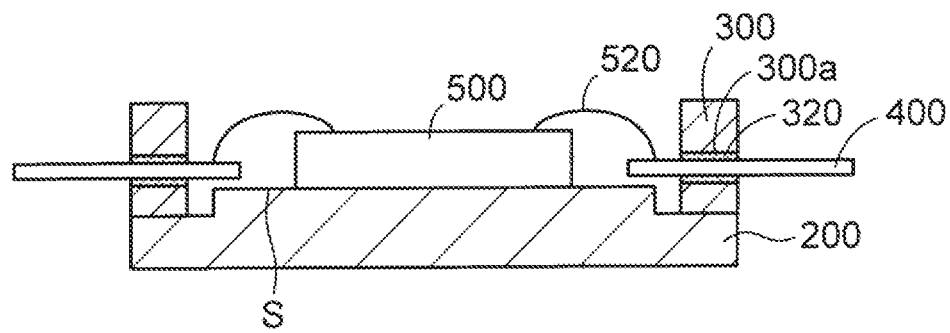
FIGS. 2A to 2C are sectional views showing a state in which an electronic component is mounted on the first electronic component package according to the preliminary matter and a lid member is welded to the first electronic component package.

As shown in FIG. 2A, a light-emitting element 500 is mounted as an electronic component in the mounting portion S inside the metal frame 300. Then, the light-emitting element 500 is connected with the leads 400 inside the metal frame 300 by metal wires 520.

Figure 2B:
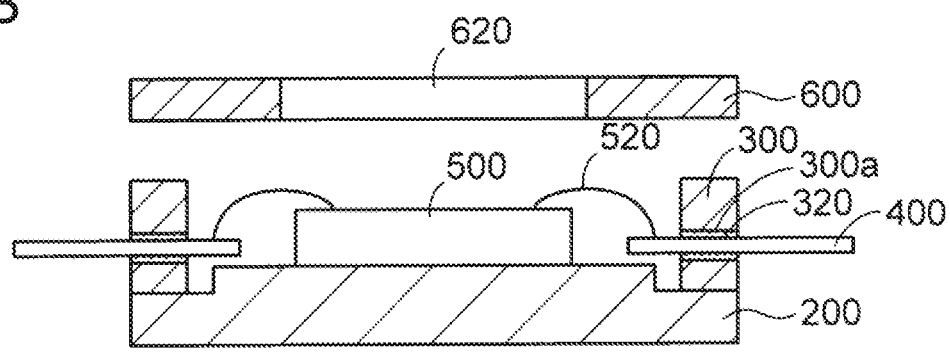

Next, a lid member 600 made of an iron-nickel alloy is prepared, as shown in FIG. 2B. A window glass 620 is hermetically sealed in an opening portion provided at a central portion of the lid member 600.

Figure 2C:
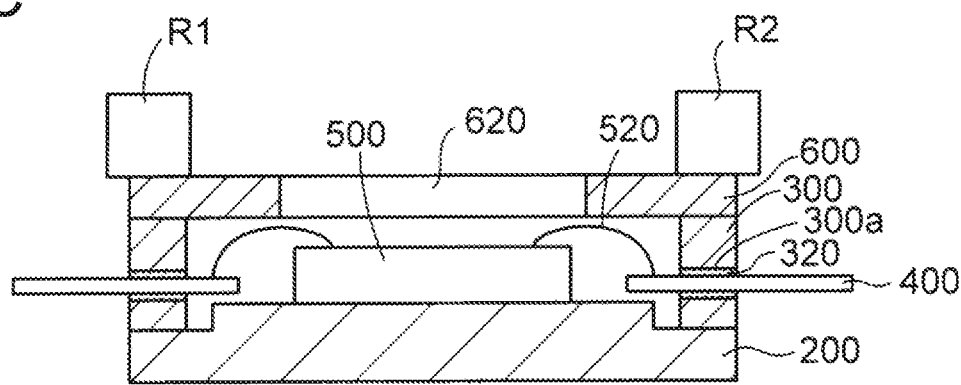

As shown in FIG. 2C, the lid member 600 of FIG. 2B is disposed on the metal frame 300 of FIG. 1B. Further, the lid member 600 is bonded to an upper surface of the metal frame 300 by seam welding.

In the seam welding, a pair of roller electrodes R1 and R2 press down the lid member 600, and a current is made to flow between the roller electrodes R1 and R2. In this state, resistance welding is performed continuously by the roller electrodes R1 and R2 that are rotated while moving on peripheral edges of the lid member 600.

The seam welding is performed while the peripheral edges of the lid member 600 are pressed down by the pair of roller electrodes R1 and R2. Accordingly, stress is applied to the glass sealing portions 320 in the through holes 300a of the metal frame 300 during the seam welding. For this reason, there is a fear that the glass sealing portions 320 may be broken to impair airtightness. When the airtightness is impaired, performance of the light-emitting element 500 deteriorates.

Therefore, there is a demand for a structure in which the stress applied to the glass sealing portions 320 can be reduced when the seam welding is performed.

In addition, the metal frame 300 is formed as follows. That is, a metal tube made of a drawn material is cut off to thereby obtain a frame member. Then, the frame member is additionally machined so that the through holes 300a for glass sealing are formed in the frame member by cutting. Thus, there is a problem that the manufacturing of the metal frame 300 may increase the cost.

As a measure against this problem, the metal frame 300 can be manufactured by stamping so that the cost can be reduced. However, in order to manufacture the metal frame 300 by stamping, it is necessary to punch a central portion of a block-like metal body by stamping. The metal body is about 3 mm to 5 mm thick.

On this occasion, a punched area of the block-like metal body is so large that the remaining width of the metal frame 300 is as narrow as about 1 mm. For this reason, it is difficult to punch the block-like metal body to obtain the metal frame 300 accurately.

Figure 3A:
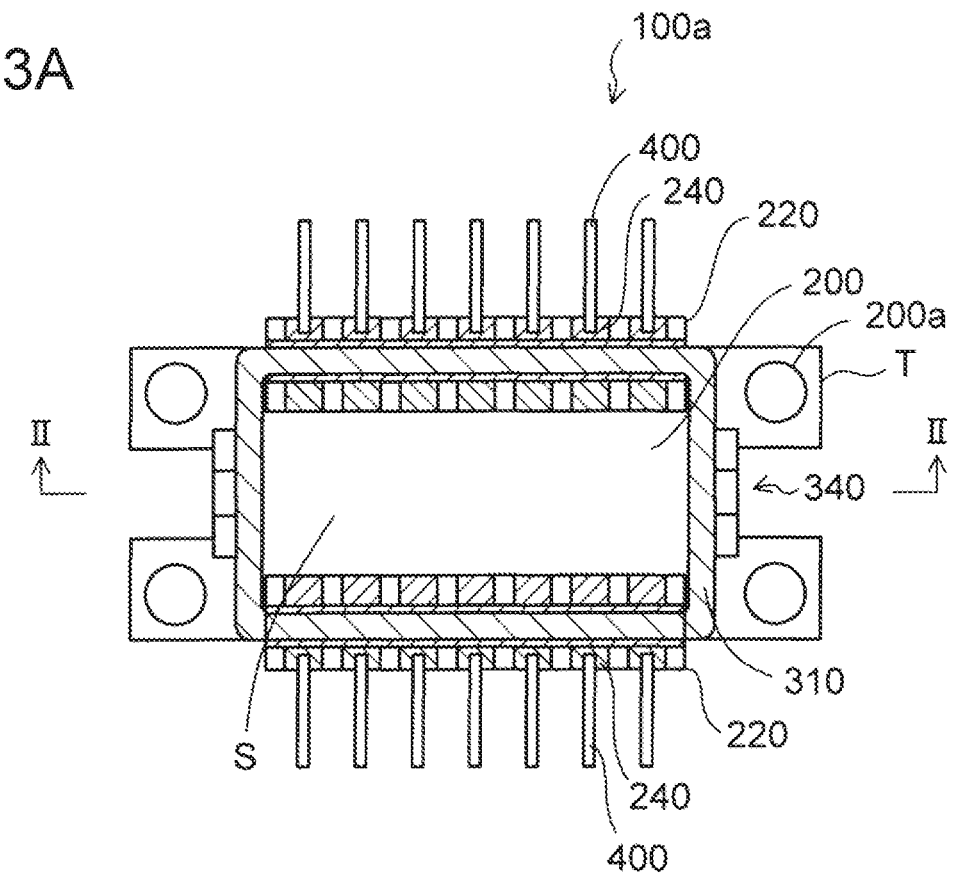
FIGS. 3A and 3B are a plan view and a sectional view showing a second electronic component package according to the preliminary matter.
Figure 3B:
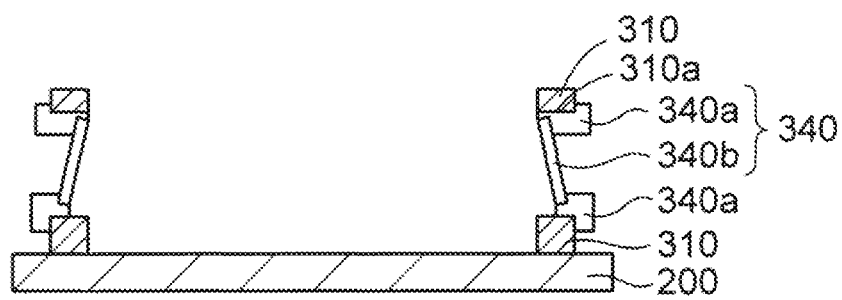

Next, a second electronic component package according to the preliminary matter will be described. FIG. 3A is a plan view showing the second electronic component package according to the preliminary matter. FIG. 3B is a sectional view taken along a line II-II of FIG. 3A.

In the second electronic component package 100a according to the preliminary matter, as shown in FIGS. 3A and 3B, ceramic members 220 are brazed and disposed on widthwise opposite end portions of a metal plate 200 respectively. The metal plate 200 is shaped like a rectangle.

The metal plate 200 is formed out of copper. Two protruding portions T extend from each of lengthwise opposite end portions of the metal plate 200. A screw hole 200a where a screw can be fastened is provided in each of the protruding portions T.

A plurality of electrodes 240 made of a metal are disposed side by side on an upper surface of each of the ceramic members 220. In addition, a metal frame 310 is disposed on the metal plate 200 and the ceramic members 220. A ceramic spacer (not shown) is disposed between the electrodes 240 on each of the ceramic members 220 and the metal frame 310. The metal frame 310 is a tubular frame member in which straight-shaped side plates are erectly provided on four sides.

In this manner, the metal frame 310 is bonded on the metal plate 200 and the ceramic members 220 airtightly by a brazing filler material.

In addition, leads 400 are bonded to the electrodes 240 disposed on the ceramic members 220 outside the metal frame 310. Front end portions of the electrodes 240 are disposed in a mounting portion S inside the metal frame 310.

Further, opening portions 310a are provided respectively in a pair of opposed ones of the side plates of the metal frame 300, as shown in FIG. 3B. Window components 340 are hermetically sealed in the opening portions 310a of the metal frame 310. Each of the window components 340 is formed from a frame portion 340a and a window glass 340b. The window glass 340b is hermetically sealed in the frame portion 340a. The frame portion 340a is bonded to a corresponding one of the opening portions 310a of the metal frame 310 by a brazing filler material.

Figure 4A:
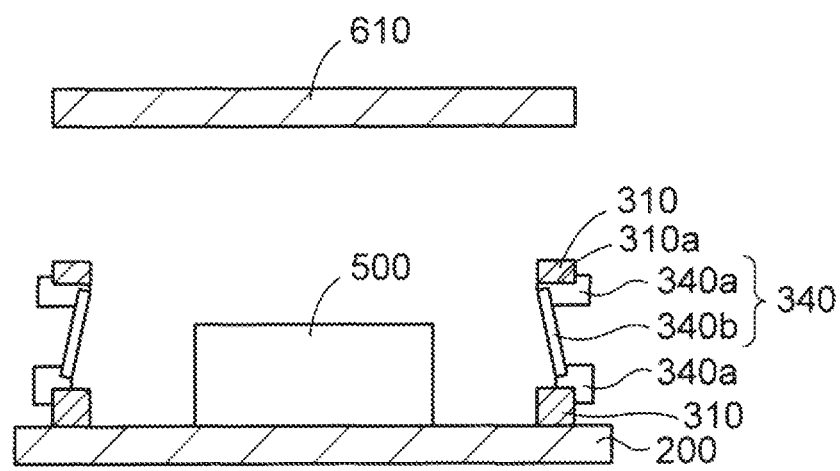
FIGS. 4A and 4B are sectional views showing a state in which an electronic component is mounted on the second electronic component package according to the preliminary matter and a lid member is welded to the second electronic component package.

Next, a light-emitting element 500 is mounted in the mounting portion S inside the metal frame 310, as shown in FIG. 4A. Then, the light-emitting element 500 is connected with the electrodes 240 (FIG. 3A) by metal wires (not shown). Further, a lid member 610 made of an iron-nickel alloy is prepared.

Figure 4B:
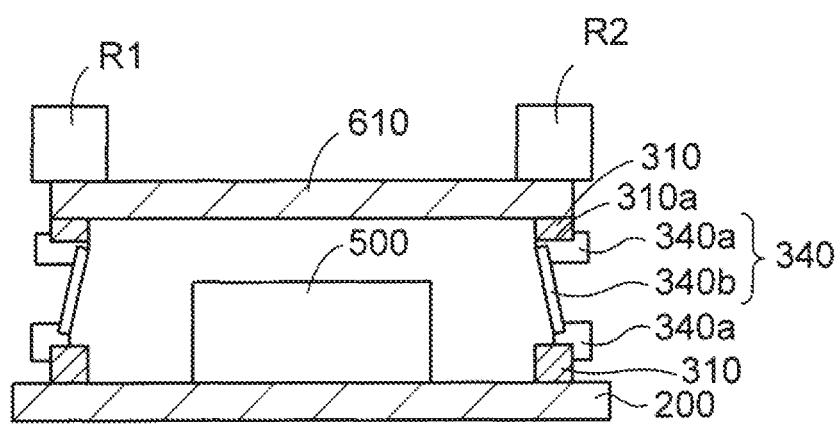

By seam welding that has been described above in FIG. 2C, a current is made to flow between a pair of roller electrodes R1 and R2 to thereby bond the lid member 610 to an upper surface of the metal frame 310, as shown in FIG. 4B.

When the seam welding is performed, stress is applied to the metal frame 310 and the ceramic members 220 by welding pressure of the roller electrodes R1 and R2. Therefore, there is a fear that damage may be given to respective bonded portions of the ceramic members 220 and the window components 340.

Therefore, there is a demand for a structure in which the stress applied to the metal frame 310 and the ceramic members 220 can be reduced when the seam welding is performed.

In addition, the metal frame 310 of the second electronic component package 100a is formed in a similar manner to or the same manner as that of the aforementioned first electronic component package 100 as follows. That is, a metal tube made of a drawn material is cut off to thereby obtain a frame member. Then, the frame member is additionally machined so that opening portions in which window components can be disposed are formed in the frame member by cutting. Thus, there is a problem that the manufacturing of the metal frame 310 may increase the cost.

The aforementioned problems can be solved by electronic component packages according to undermentioned embodiments.

First Embodiment

An electronic component package according to first embodiment can solve the aforementioned problem inherent in the first electronic component package 100 according to the preliminary matter.

Figure 5:
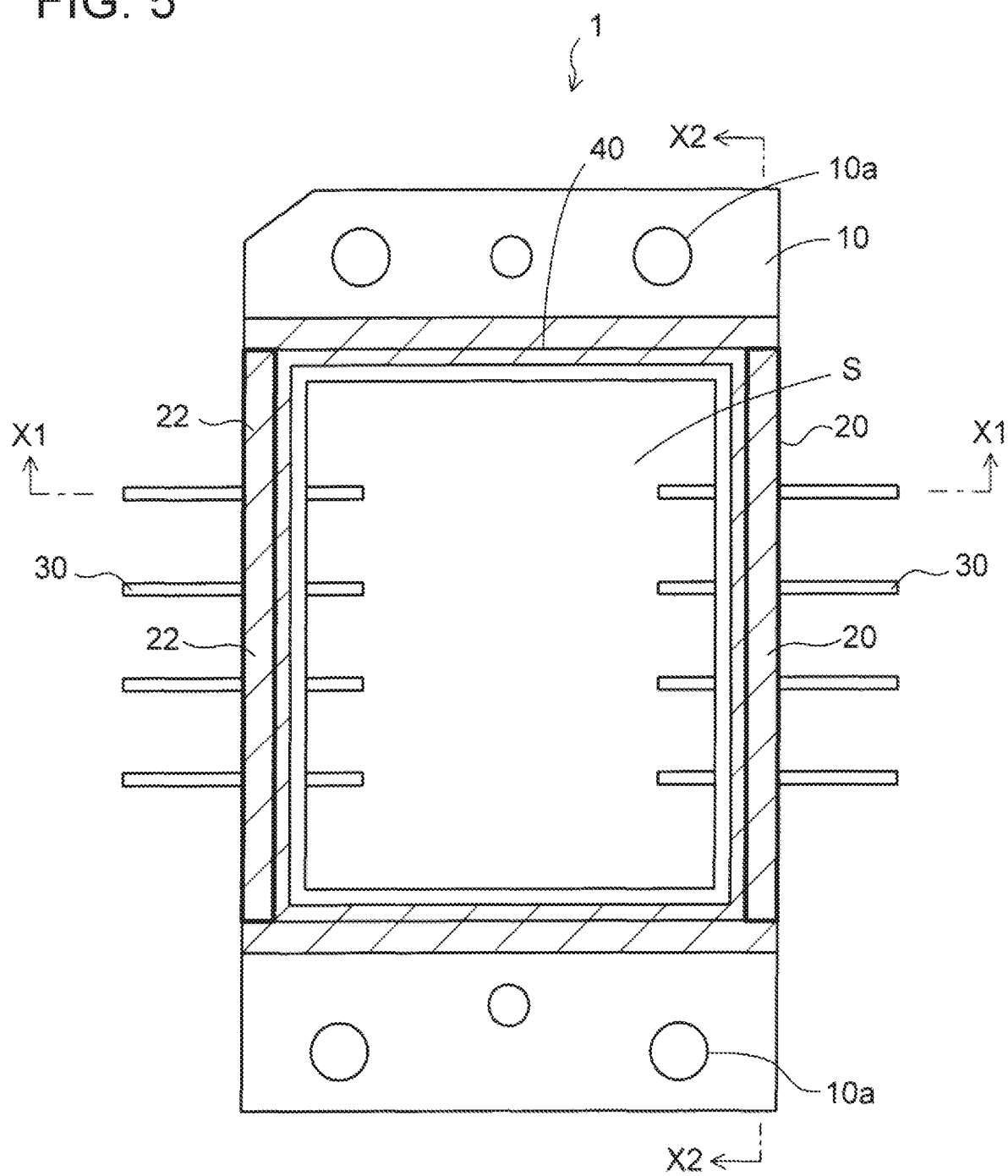
FIG. 5 is a plan view showing an electronic component package according to a first embodiment.
Figure 6A:
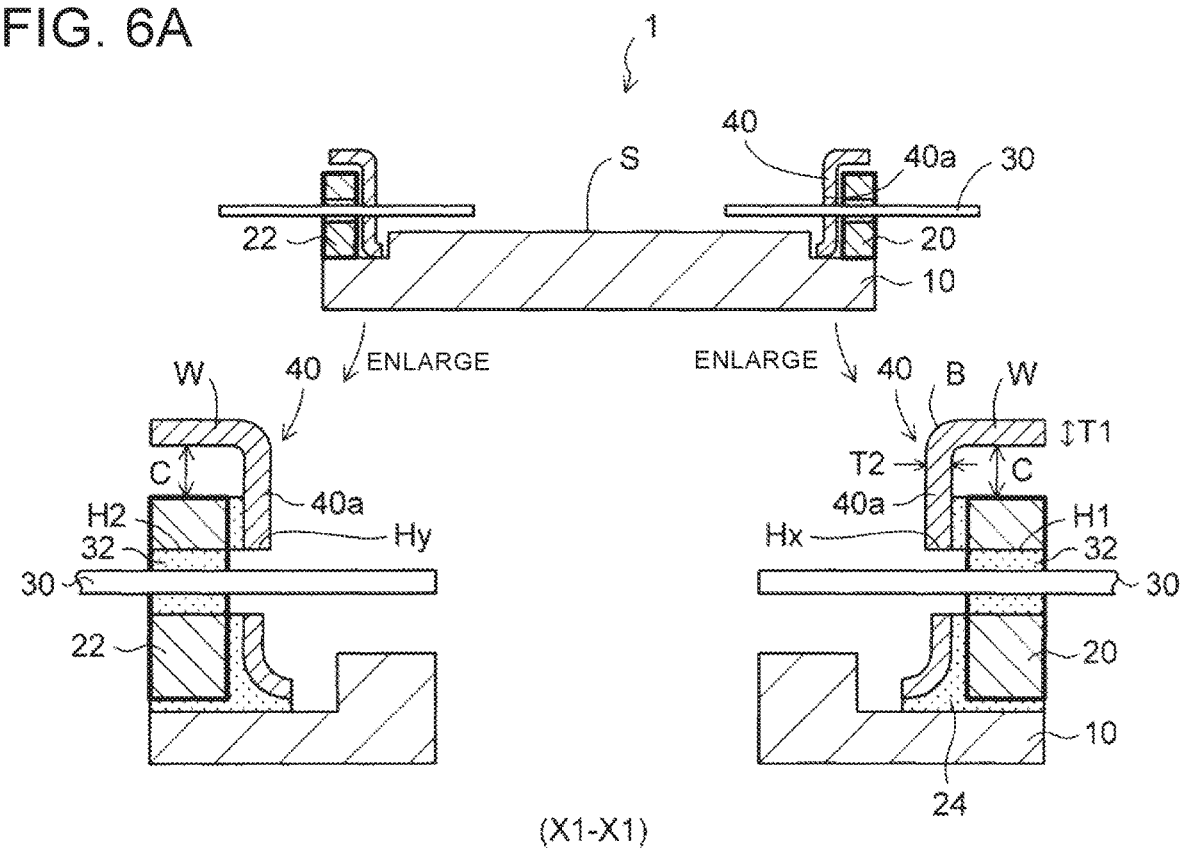
FIG. 6A is a sectional view taken along a line X1-X1 of FIG. 5.
Figure 6B:
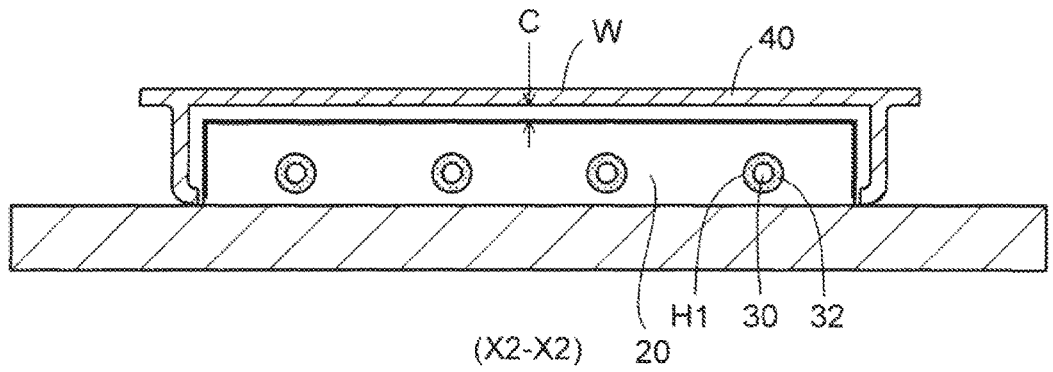
FIG. 6B is a sectional view taken along a line X2-X2 of FIG. 5.

FIG. 5 is a plan view showing the electronic component package according to the first embodiment. FIG. 6A is a sectional view taken along a line X1-X1 of the electronic component package of FIG. 5. FIG. 6B is a sectional view taken along a line X2-X2 of the electronic component package of FIG. 5.

As shown in FIG. 5, the electronic component package 1 according to the first embodiment is provided with a metal plate 10. The metal plate 10 is formed out of copper (Cu) and shaped like a rectangle. Screw holes 10a in which screws can be fastened are provided in each of lengthwise opposite end portions of the metal plate 10.

In addition, additionally refer to FIG. 6A to FIG. 5. A first metal wall 20 is disposed on one of widthwise opposite end portions of the metal plate 10, and a second metal wall 22 is disposed on the other widthwise end portion of the metal plat 10. The first metal wall 20 and the second metal wall 22 paired with each other are disposed on the opposite end portions of the metal plate 10 to be opposed to each other and separated from each other.

The first metal wall 20 and the second metal wall 22 are not disposed on lengthwise front regions of the screw holes 10a of the metal plate 10 so that the lengthwise front regions of the screw holes 10a of the metal plate 10 are opened.

The first metal wall 20 and the second metal wall 22 are formed out of iron (Fe) and bonded to the metal plate 10 by a silver (Ag) brazing filler material 24.

In addition, through holes H1 disposed to be lined up sideways are formed in the first metal wall 20, as shown in FIG. 6A and FIG. 6B.

Refer to a partially enlarged view of FIG. 6A. Leads 30 are inserted through the through holes H1 of the first metal wall 20. The leads 30 are airtightly sealed with glass sealing portions 32 in the through holes H1.

In addition, in a similar manner or the same manner, through holes H2 disposed to be lined up sideways are formed in the second metal wall 22. Leads 30 are inserted through the through holes H2 of the second metal wall 22. The leads 30 are airtightly sealed with glass sealing portions 32 in the through holes H2.

The leads 30 are disposed to extend from the inside of the first metal wall 20 and the second metal wall 22 toward the outside of the same.

Further, a metal frame 40 is disposed on the metal plate 10 in a region inside the first metal wall 20 and the second metal wall 22, as shown in FIG. 5 and FIGS. 6A and 6B. The metal frame 40 is formed out of iron.

In FIG. 5, the first metal wall 20 and the second metal wall 22 are indicated by thick lines. The metal frame 40 is indicated by hatched lines. The metal frame 40 is drawn in perspective. The metal frame 40 is formed to be connected integrally with the first metal wall 20 and the second metal wall 22 so as to surround the rectangular region inside the first metal wall 20 and the second metal wall 22. The metal frame 40 is a tubular component whose top and bottom plates are opened.

Refer to the partially enlarged view of FIG. 6A. In one side plate 40a of the metal frame 40 on an inner side of the first metal wall 20, opening holes Hx are formed at positions corresponding to the through holes H1 of the first metal wall

20. As shown in FIG. 6B, the through holes of the first metal wall 20 are disposed to be lined up sideways.

Thus, the leads 30 disposed on a right side are inserted through the through holes H1 of the first metal wall 20 and the opening holes Hx of the metal frame 40.

In a similar manner or the same manner, in another side plate 40a of the metal frame 40 on an inner side of the second metal wall 22, opening holes Hy are formed at positions corresponding to the through holes H2 of the second metal wall 22. Thus, the leads 30 disposed on a left side are inserted through the through holes H2 of the second metal wall 22 and the opening holes Hy of the metal frame 40.

The leads 30 are simply inserted through the opening holes Hx and Hy of the metal frame 40 but not hermetically sealed with any glass in the opening holes Hx and Hy. The leads 30 are hermetically sealed with the glass sealing portions 32 in the through holes H1 and H2 of the first and second metal walls 20 and 22. Therefore, the leads 30 do not have to be hermetically sealed with glass in the opening holes Hx and Hy of the metal frame 40.

The first, second metal wall 20, 22 is 1 mm to 1.5 mm thick. The metal frame 40 is 0.5 mm to 1 mm thick. The leads 30 are hermetically sealed with the glass sealing portions 32 in the through holes H1, H2 of the first, second metal wall 20, 22 that is thick enough. Consequently, sufficient airtightness can be obtained.

Thus, a region inside the metal frame 40 serves as a mounting portion S where an electronic component can be stored. The electronic component can be mounted on the metal plate 10 in the mounting portion S.

As shown in the partially enlarged view of FIG. 6A, the metal frame 40 is provided with a welding portion W in which an upper end portion of the metal frame 40 is disposed to be bent outward due to a bent portion B. That is, the metal frame 40 is provided with the side plates 40a that are opposed to the first and second metal walls 20 and 22, the bent portion B that is connected to the side plates 40a and has a round shape, and the welding portion W that is connected to the bent portion B and to which a lid member 60 can be bonded. The upper end portions of the side plates 40a of the metal frame 40 are bent horizontally toward the outside to thereby form the welding portion W. An upper surface of the welding portion W is a flat surface. A horizontal length of the welding portion W is about 1 mm to 2 mm. The bent portion B connected to the welding portion W has a curved round shape with roundness.

When the plate thickness of the metal frame 40 is in a range of 0.5 mm to 1 mm, the roundness of the round shape of the bent portion is set at R 0.5 mm to R 1 mm. R 0.5 mm corresponds to a circular arc shape of a circle with a radius of 0.5 mm. R 1 mm corresponds to a circular arc shape of a circle with a radius of 1 mm.

In addition, a lower end portion of the metal frame 40 is bent inward into a round shape, and a lower surface of the same lower end portion is airtightly bonded to the metal plate 10 by the silver brazing filler material 24. Further, outer surfaces of the side plates 40a of the metal frame 40 are bonded to inner surfaces of the first metal wall 20 and the second metal wall 22 respectively by the silver brazing filler material 24.

Thus, the metal frame 40 and the first, second metal wall 20, 22 are bonded to each other by the silver brazing filler material 24, and the lower surface of the metal frame 40 and a lower surface of the first, second metal wall 20, 22 are bonded to the metal plate 10 by the silver brazing filler material 24.

In addition, a clearance C is provided between an upper surface of the first metal wall 20 and the lower surface of the welding portion W of the metal frame 40. The clearance C is, for example, about 1 mm high. The clearance C is also provided between an upper surface of the second metal wall 22 and the lower surface of the welding portion W of the metal frame 40.

As shown in FIG. 6B, the clearance C between the first metal plate 20 and the welding portion W of the metal frame 40 is provided to have one and the same height all over the upper surface side of the first metal wall 20.

In the electronic component package 1 of FIG. 6A, as will be described later, the lid member is bonded to the welding portion W of the metal frame 40 by seam welding after the electronic component is mounted in the mounting portion S. On this occasion, the clearance C is provided between the first metal wall 20 and the welding portion W of the metal frame 40. Accordingly, a structure is formed in such a manner that welding pressure during the seam welding is prevented from being directly transmitted to the glass sealing portions 32.

Accordingly, when the lid member is seam-welded to the metal frame 40, the glass sealing portions 32 provided in the first, second metal wall 20, 22 can be prevented from being broken to impair airtightness.

In addition, as shown in the partially enlarged view of FIG. 6A, a thickness T1 of the welding portion W of the metal frame 40 is set to be thinner than a thickness T2 of each of the side plates 40a of the metal frame 40. For example, the thickness T1 of the welding portion W is 0.3 mm to 0.4 mm, and the thickness T2 of the side plate 40a is about 0.5 mm.

Thus, the welding pressure during the seam welding can be absorbed by the welding portion W of the metal frame 40 that is thinner in thickness, so that stress transmitted to the glass sealing portions 32 can be reduced.

Further, the welding portion W of the metal frame 40 is bent due to the bent portion B having the round shape. Accordingly, the welding pressure applied to the welding portion W can be dispersed, so that the stress transmitted to the glass sealing portions 32 can be reduced.

Next, a method for manufacturing the metal frame 40 and the first, second metal wall 20, 22 to be used in the electronic component package 1 will be described.

Figure 7A:
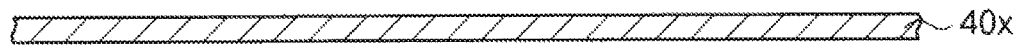
FIGS. 7A to 7C are sectional views showing a method for manufacturing a metal frame of the electronic component package according to the first embodiment (Part 1)

First, the method for manufacturing the metal frame 40 will be described. In the method for manufacturing the metal frame 40, first, an iron plate 40x about 0.5 mm thick is prepared, as shown in FIG. 7A.

Figure 7B:
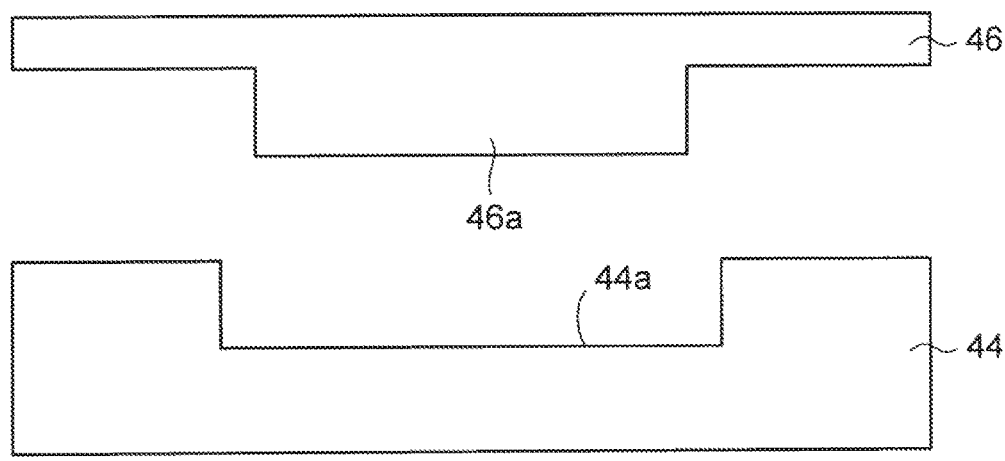

Next, a die 44 and a punch 46 are prepared as a mold, as shown in FIG. 7B. The die 44 is provided with a recess 44a on its upper surface side. In addition, the punch 46 is provided with a protrusion 46a corresponding to the recess 44a of the die 44, on a lower surface side of the punch 46.

Figure 7C:
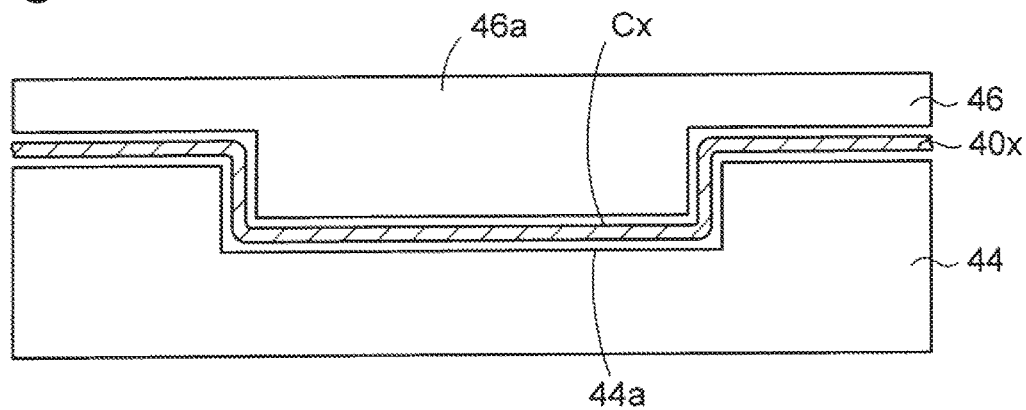

As shown in FIG. 7C, the iron plate 40x is disposed on the die 44, and pressed against the recess 44a of the die 44 by the protrusion 46a of the punch 46. As a result, a cavity portion Cx is formed.

Figure 8A:
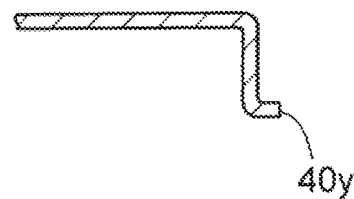
FIGS. 8A to 8D are sectional views showing the method for manufacturing the metal frame of the electronic component package according to the first embodiment (Part 2)
Figure 8A:
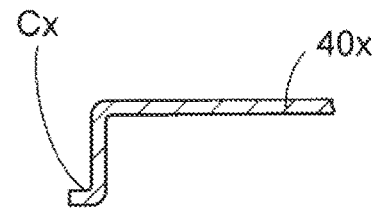

Then, as shown in FIG. 8A, a bottom plate of the cavity portion Cx of the iron plate 40x is punched by another mold. As a result, an opening portion 40y is formed.

Figure 8B:
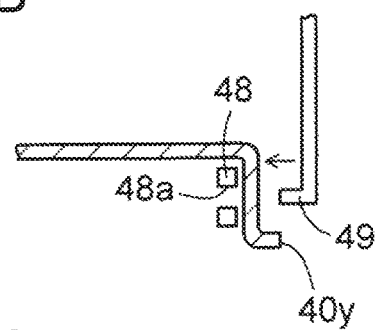
Figure 8B:
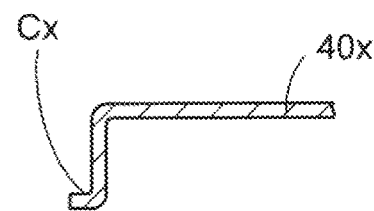

Next, as shown in FIG. 8B, an outer surface of a side plate 40a of the cavity portion Cx of the iron plate 40x is supported by a die 48. The die 48 is internally provided with an opening portion 48a. Further, a punch 49 that can move horizontally is prepared. The side plate 40a of the cavity portion Cx is punched by the punch 49.

Figure 8C:
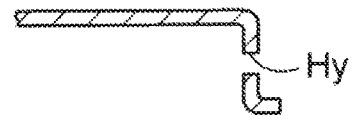
Figure 8C:
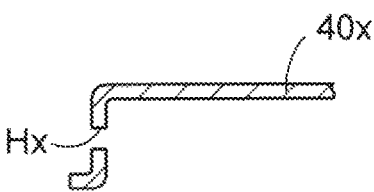

Thus, as shown in FIG. 8C, opening holes Hy are formed in the side plate 40a of the cavity portion Cx.

A diameter of the punch 49 corresponds to a diameter of the opening portion 48a of the die 48. After the side plate 40a is punched by the punch 49, the punch 49 is disposed in the opening portion 48a of the die 48.

In a similar manner or the same manner, opening holes Hx are formed in an opposite side plate 40a to the side plate 40a where the opening holes Hy have been formed.

Figure 8D:
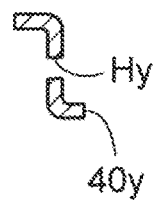
Figure 8D:
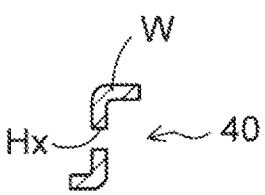

Then, as shown in FIG. 8D, the iron plate 40x surrounding the cavity portion Cx is punched. As a result, each of individual metal frames 40 is obtained. A portion of a flat portion of the iron plate 40x is left like a flange at an upper end of the cavity portion Cx to serve as an annular welding portion W.

The welding portion W is made thinner in thickness than each of the side plates 40a. Accordingly, a portion of the iron plate 40x serving as the welding portion W is squashed by pressing at a predetermined stage of the aforementioned step so as to be made thinner.

Thus, the metal frame 40 to be used in the electronic component package 1 according to the embodiment can be manufactured easily by pressing the iron plate 40x that is a thin plate. Differently from the metal frame 300 according to the preliminary matter, the metal frame 40 does not use a technique of cutting a metal tube made of a drawn material to increase the cost. Accordingly, the cost can be reduced.

Figure 9A:
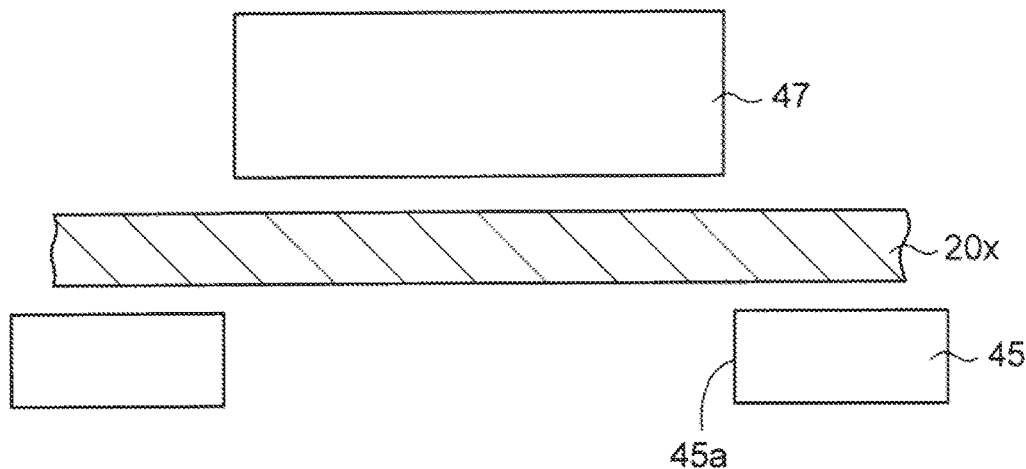
FIGS. 9A to 9C are sectional views and a perspective view showing a method for manufacturing a metal wall of the electronic component package according to the first embodiment.

Next, the method for manufacturing the first, second metal wall 20, 22 will be described. In the method for manufacturing the first, second metal wall 20, 22, first, a die 45 provided with an opening portion 45a and a punch 47 are prepared as a mold, as shown in FIG. 9A.

A size of the opening portion 45a of the die 45 corresponds to a size of the punch 47. An iron plate 20x having a thickness of 1 mm to 1.5 mm is disposed on the die 45.

Figure 9B:
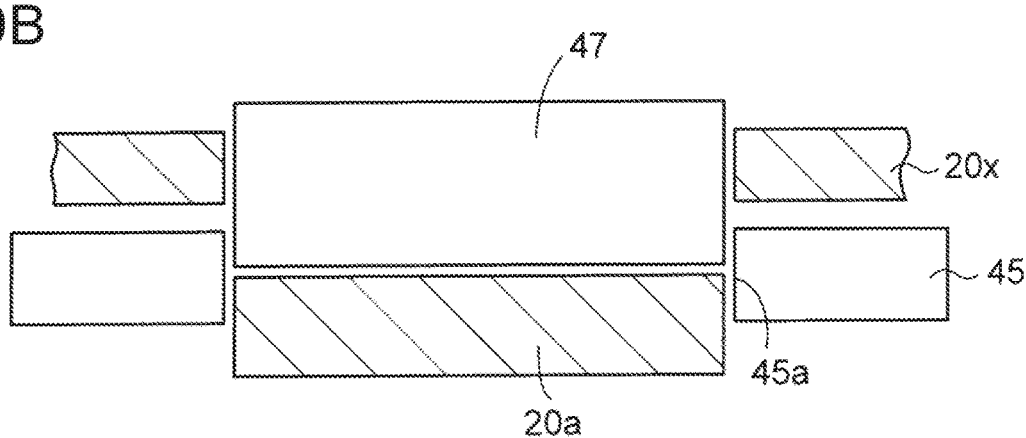

Next, as shown in FIG. 9B, the iron plate 20x is punched by the punch 47. Thus, a metal wall 20a is obtained from the punched member.

Figure 9C:
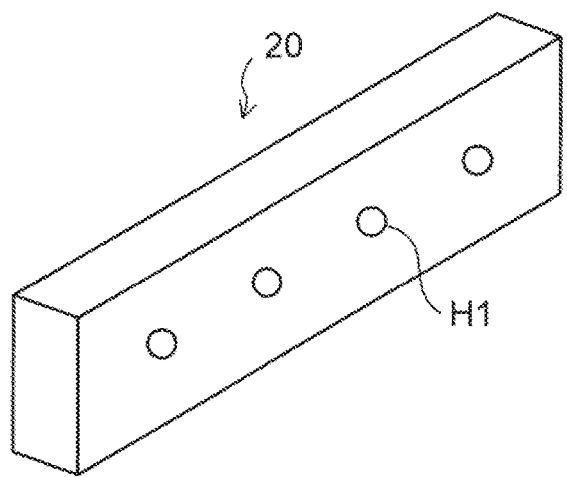

Further, as shown in FIG. 9C, through holes H1 are formed in the metal wall 20a by a punch (not shown). Thus, a first metal wall 20 is manufactured. Alternatively, the through holes H1 may be formed in the iron plate 20x by the punch prior to the step of punching the iron plate 20x by the punch 47 of FIG. 9B. The second metal wall 22 is also manufactured by a similar manufacturing method or the same manufacturing method.

Thus, the first, second metal wall 20, 22 to be used in the electronic component package 1 according to the embodiment can be manufactured easily by stamping the iron plate 20x that is a thin plate. Differently from the metal frame 300 according to the preliminary matter, the first, second metal wall 20, 22 does not use a technique of cutting a metal tube made of a drawn material to increase the cost. Accordingly, the cost can be reduced.

Figure 10A:
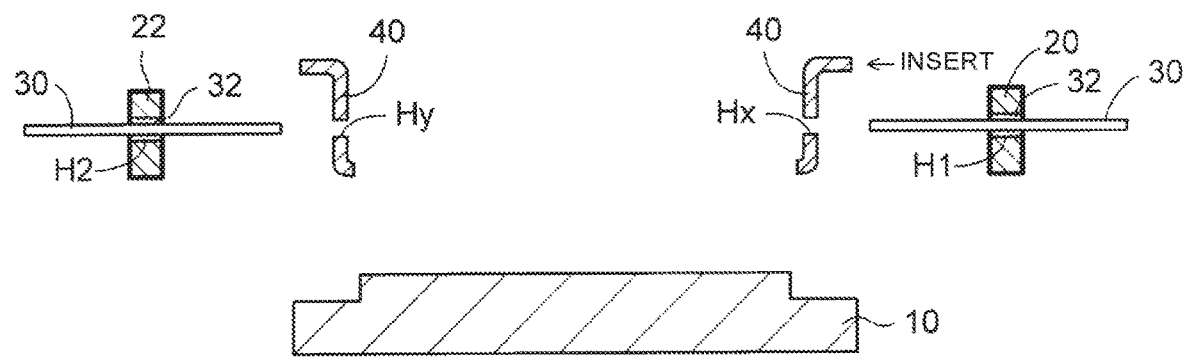
FIGS. 10A and 10B are sectional views showing a method for manufacturing the electronic component package according to the first embodiment.

Next, the method for manufacturing the electronic component package 1 will be described. As shown in FIG. 10A, leads 30 are hermetically sealed with glass sealing portions 32 in through holes H1 and H2 of first and second metal walls 20 and 22 respectively.

On this occasion, the leads 30 are hermetically sealed while glass is melt at a temperature of about 1,000° C. Since a thermal expansion coefficient of each of the first and second metal walls 20 and 22 (iron) is larger than a thermal expansion coefficient of the glass, the glass sealing portions 32 are contracted so that high airtightness can be secured.

The leads 30 attached to the first metal wall 20 are inserted through opening holes Hx on one side of a metal frame 40. In addition, the leads 30 attached to the second metal wall 22 are inserted through opening holes Hy on an opposite side of the metal frame 40 in a similar manner or the same manner.

Figure 10B:
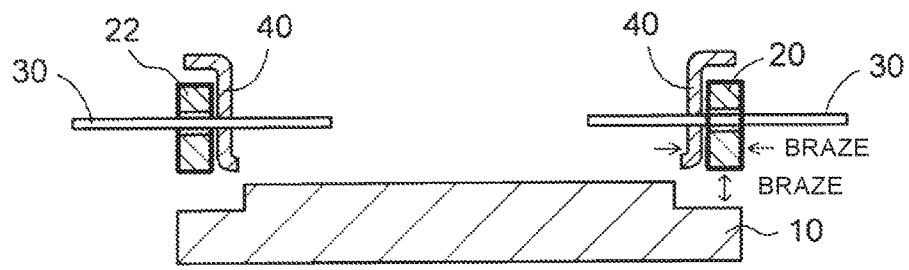

Next, as shown in FIG. 10B, inner surfaces of the first and second metal walls 20 and 22 are bonded to an outer surface of the metal frame 40 by a silver brazing filler material, and at the same time, lower surfaces of the first and second metal walls 20 and 22 and a lower surface of the metal frame 40 are bonded to a metal plate 10 by the silver brazing filler material. During the bonding performed using the silver brazing filler material, heat treatment is performed at a temperature of about 800° C.

Thus, the bonding between the first and second metal walls 20 and 22 and the metal frame 40 and the bonding between the first and second metal walls 20 and 22 with the metal frame 40 and the metal plate 10 are performed collectively.

The aforementioned electronic component package 1 of FIG. 5 and FIGS. 6A and 6B is manufactured in the aforementioned manner.

Next, a method of constructing an electronic component device using the electronic component package 1 according to the first embodiment will be described.

Figure 11A:
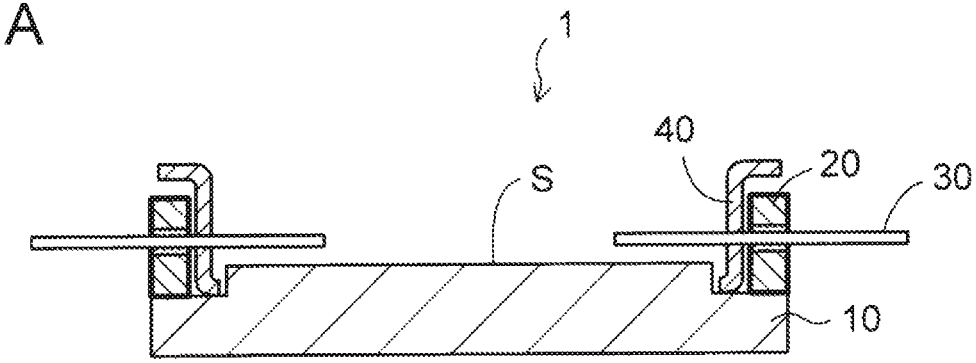
FIGS. 11A to 11C are sectional views showing a method for manufacturing an electronic component device using the electronic component package according to the first embodiment (Part 1)
Figure 11B:
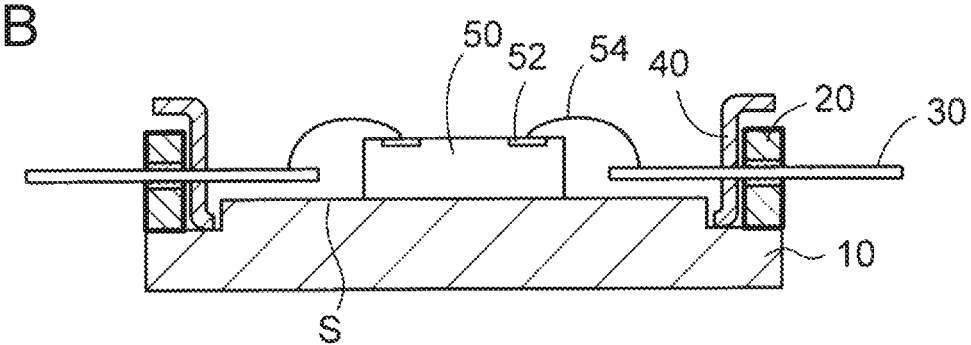

As shown in FIG. 11A, first, the aforementioned electronic component package 1 of FIG. 6A is prepared. As shown in FIG. 11B, a light-emitting element 50 provided with connection terminals 52 on its upper surface side is mounted in the mounting portion S of the electronic component package 1. The light-emitting element 50 is an example of an electronic component.

Further, the connection terminals 52 of the light-emitting element 50 are connected with the leads 30 of the electronic component package 1 by metal wires 54.

Figure 11C:
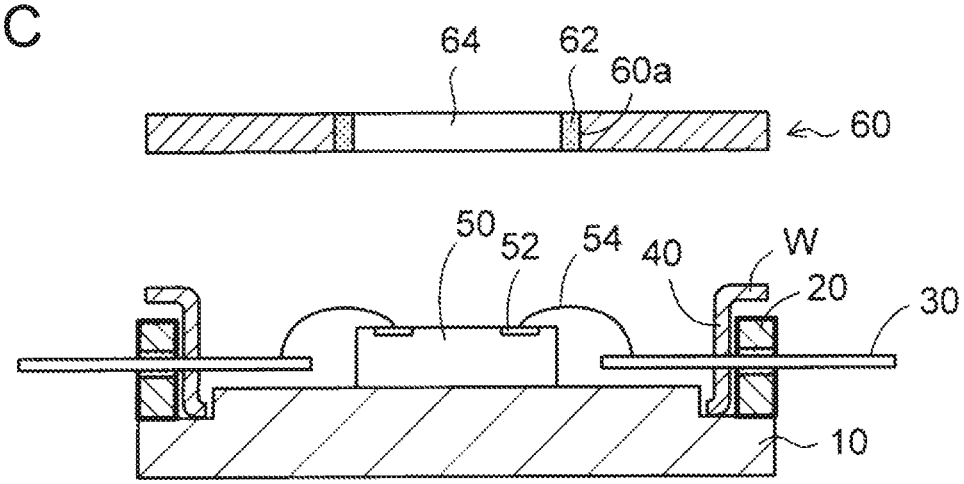

Successively, as shown in FIG. 11C, a lid member 60 is prepared. A window glass 64 is hermetically sealed with a low melting point glass 62 in an opening portion 60a provided in a central portion of the lid member 60. A body of the lid member 60 is formed out of an iron-nickel alloy.

Figure 12A:
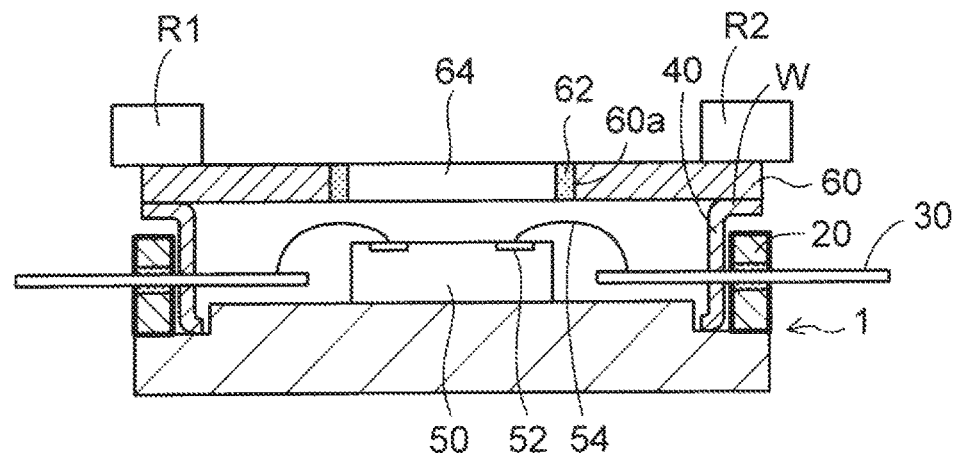
FIGS. 12A and 12B are a sectional view and a plan view showing the method for manufacturing the electronic component device using the electronic component package according to the first embodiment (Part 2)

Next, as shown in FIG. 12A, the lid member 60 is disposed on the welding portion W of the metal frame 40 of the electronic component package 1. The lid member 60 is bonded to the welding portion W of the metal frame 40 by seam welding.

Figure 12B:
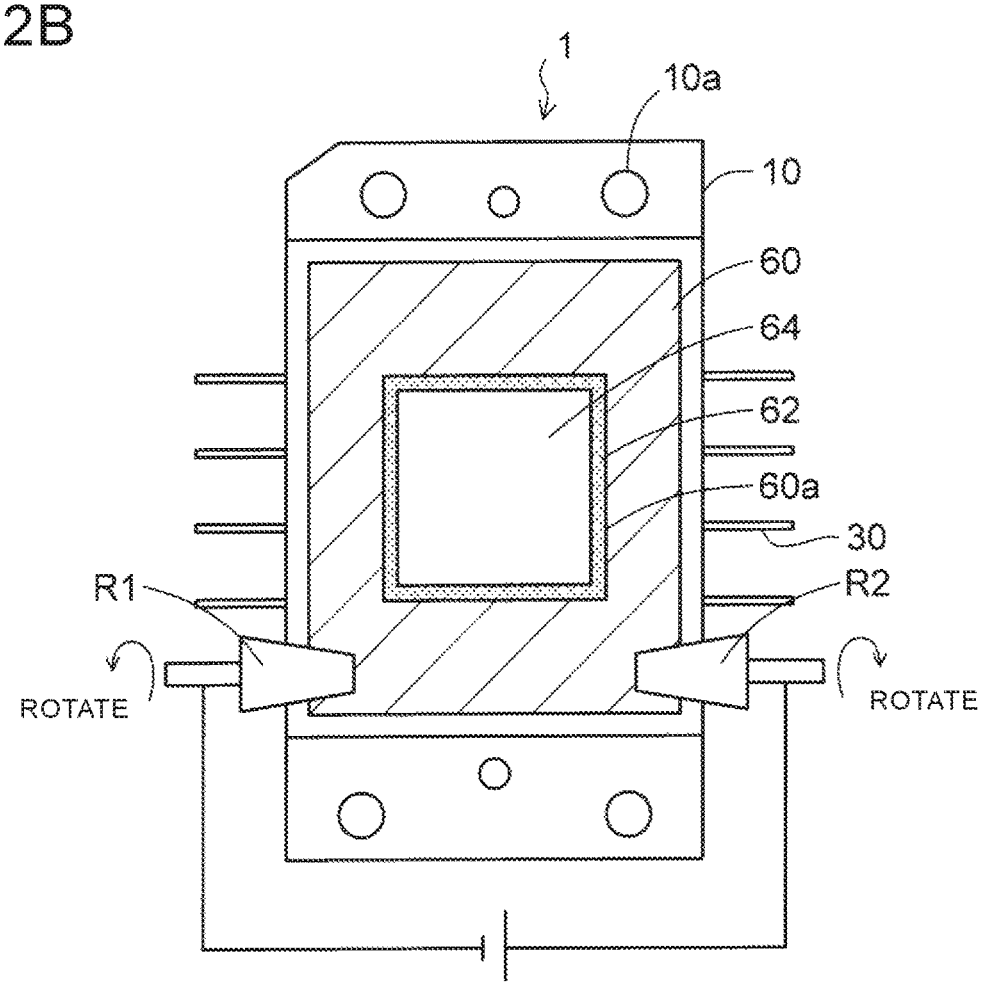

FIG. 12B is a plan view of FIG. 12A seen from above. As shown in FIG. 12B, in the seam welding, the lid member 60 is pressed down by a pair of roller electrodes R1 and R2 of a seam welding machine (not shown). In this state, resistance welding is performed continuously by the roller electrodes R1 and R2 that are rotated while moving on peripheral edges of the lid member 60.

When the roller electrodes R1 and R2 move on the peripheral edges of the lid member 60, a current is made to flow between the roller electrodes R1 and R2 to thereby generate Joule heat. The lid member 60 and the welding portion W of the metal frame 40 are welded to each other by the Joule heat.

In addition, when the roller electrodes R1 and R2 move on the peripheral edges of the lid member 60, welding pressure is always applied to the lid member 60 by the roller electrodes R1 and R2.

In the electronic component package 1 according to the embodiment, as described above, the metal frame 40 to which the lid member 60 is seam-welded is disposed as a separate component in the region inside the first and second metal walls 20 and 22 in which the leads 30 are hermetically sealed with the glass sealing portions 32.

In addition, the clearance C is provided between the first, second metal wall 20, 22 and the welding portion W of the metal frame 40. Thus, the structure is formed in such a manner that the welding pressure during the seam welding is prevented from being directly transmitted to the glass sealing portions 32.

In addition, the thickness T1 of the welding portion W of the metal frame 40 is set to be thinner than the thickness T2 of each of the side plates 40a of the metal frame 40. Further, the welding portion W of the metal frame 40 is bent due to the bent portion B having the round shape.

Thus, stress applied to the glass sealing portions 32 provided in the first, second metal wall 20, 22 when the lid member 60 is seam-welded to the metal frame 40 is reduced. Accordingly, the glass sealing portions 32 can be prevented from being broken to impair airtightness.

Figure 13:
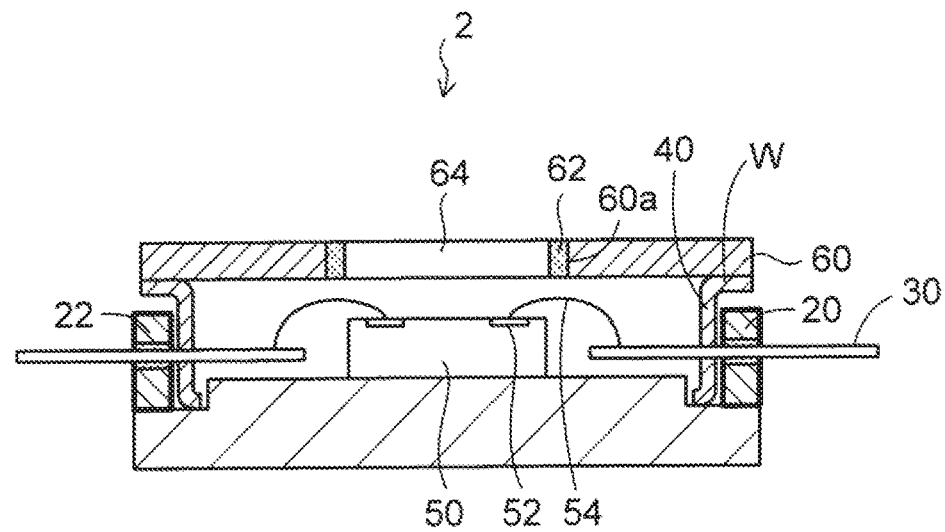
FIG. 13 is a sectional view showing the electronic component device according to the first embodiment.

In the aforementioned manner, an electronic component device 2 according to the first embodiment is obtained, as shown in FIG. 13. In the electronic component device 2 according to the first embodiment, the light-emitting element 50 is mounted as an electronic component on the aforementioned electronic component package 1 of FIG. 6A, and the lid member 60 is seam-welded to the welding portion W of the metal frame 40.

In the example of FIG. 13, the electronic component device 2 is a light-emitting device, and the light-emitting element 50 is an edge light-emitting laser. An optical path converting mirror (not shown) is disposed in the vicinity of the light-emitting element 50. An optical path of light emitted from an edge of the light-emitting element 50 is converted by 90° by the optical path converting mirror so that the light is emitted to the outside through the window glass 64 of the lid member 60 of the electronic component package 1.

In the electronic component device 2 according to the first embodiment, the stress applied to the glass sealing portions 32 when the lid member 60 is seam-welded is reduced so that there is no fear that airtightness may be impaired. Consequently, reliability can be improved. In addition, the metal frame 40 and the first and second metal walls 20 and 22 can be manufactured by stamping. Accordingly, the cost can be reduced.

Second Embodiment

An electronic component package according to a second embodiment can solve the aforementioned problem inherent in the second electronic component package 100a according to the preliminary matter.

Figure 14:
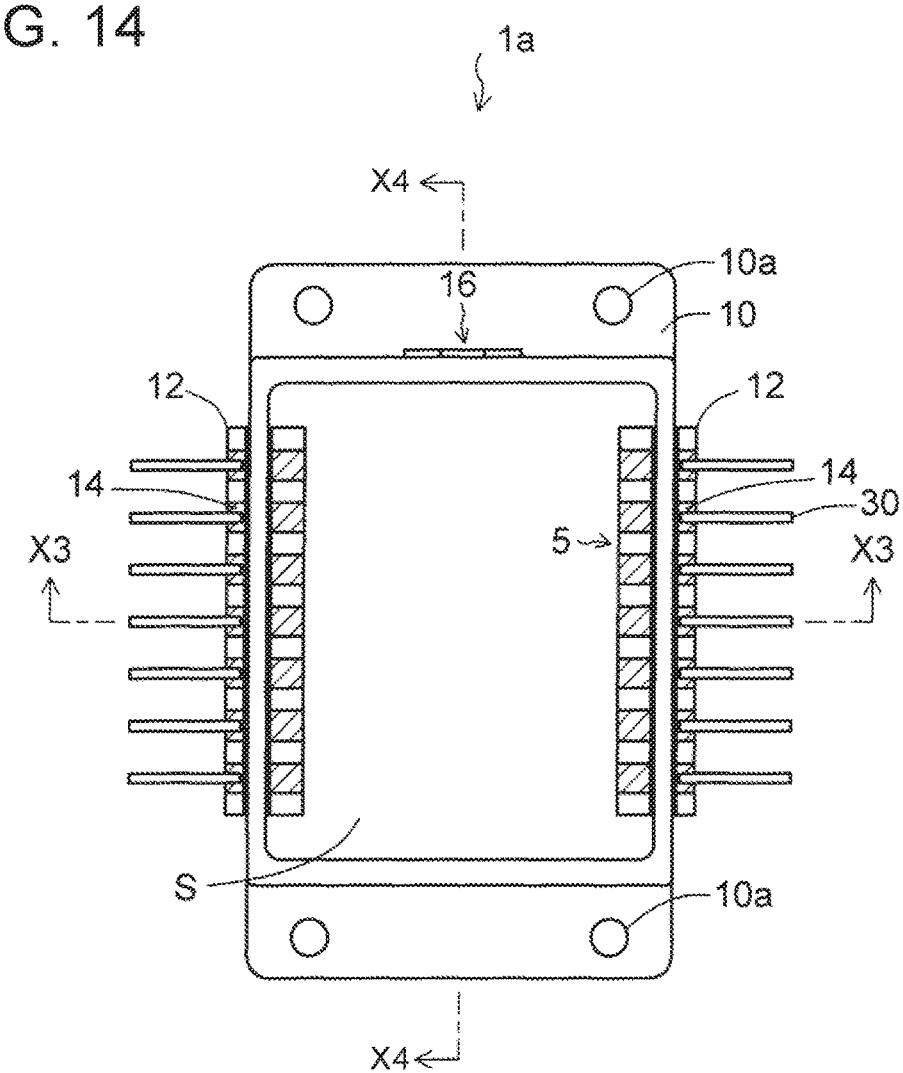
FIG. 14 is a plan view showing an electronic component package according to a second embodiment.
Figure 15:
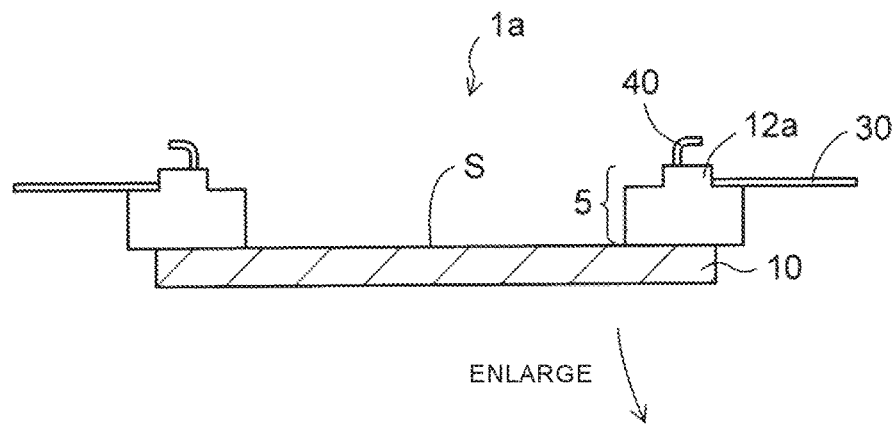
FIG. 15 is an enlarged sectional view taken along a line X3-X3 of FIG. 14.
Figure 16:
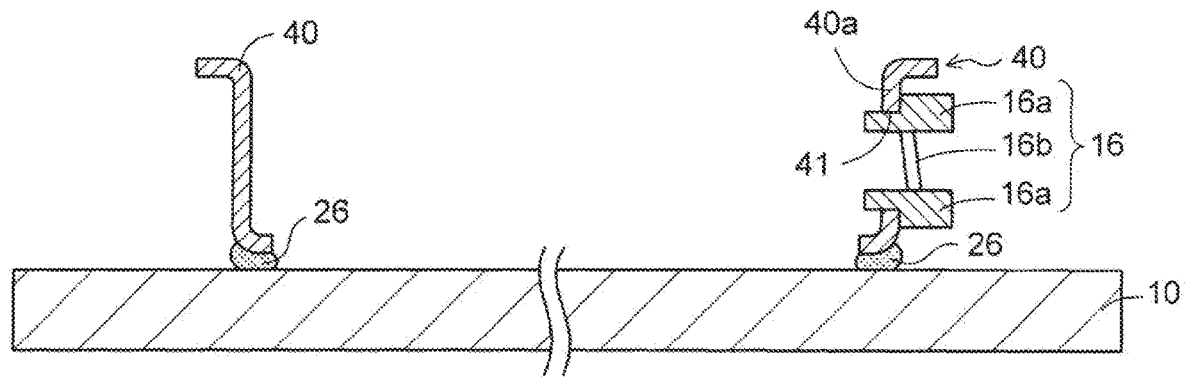
FIG. 16 is an enlarged sectional view taken along a line X4-X4 of FIG. 14.

FIGS. 14 to 16 are views for explaining the electronic component package according to the second embodiment.

FIG. 14 is a plan view showing the electronic component package according to the second embodiment. FIG. 15 is an enlarged sectional view taken along a line X3-X3 of FIG. 14. FIG. 16 is an enlarged sectional view taken along a line X4-X4 of FIG. 14.

In the second electronic component package 1a according to the second embodiment, as shown in FIG. 14, a pair of ceramic members 12 are disposed on widthwise opposite end portions of a metal plate 10. The metal plate 10 is made out of copper and shaped like a rectangle. The pair of ceramic members 12 are disposed on the opposite end portions of the metal plate 10 to be opposed to each other and separated from each other. In addition, screw holes 10a in which screws can be fastened are provided in each of lengthwise opposite end portions of the metal plate 10.

A plurality of electrodes 14 made of a metal are disposed side by side on each of upper surfaces of the paired ceramic members 12. Refer to the partially enlarged view of FIG. 15 additionally. A belt-like ceramic spacer 12a that covers portions of the electrodes 14 is formed on each of the ceramic members 12.

Each of electrode-including ceramic components 5 is constructed from the ceramic member 12, the electrodes 14 and the ceramic spacer 12a. Lower surfaces of the electrode-including ceramic components 5 are bonded on the metal plate 10 by a gold-tin brazing filler material 26.

As shown in FIG. 14 and the partially enlarged view of FIG. 15, a metal frame 40 is disposed on the metal plate 10 and the ceramic spacers 12a on the ceramic members 12. The metal frame 40 is a tubular component whose top and bottom plates are opened.

As shown in the partially enlarged view of FIG. 15, a notch opening portion 40z corresponding to a total thickness of the ceramic member 12 and the ceramic spacer 12a is formed on a lower surface side of a portion of the metal frame 40 disposed on the ceramic spacer 12a. The ceramic member 12 and the ceramic spacer 12a are fitted into the notch opening portion 40z of the metal frame 40.

The ceramic spacer 12a is disposed between the ceramic member 12 and an inner surface of the notch opening portion 40z of the metal frame 40. Thus, the electrodes 14 on the ceramic member 12 are electrically insulated from the metal frame 40.

On the other hand, at a region of the metal frame 40 where the ceramic member 12 is not disposed, as shown in a left-side region of FIG. 16, the notch opening portion 40z is not formed but a lower end of the metal frame 40 is bonded on the metal plate 10 by the gold-tin brazing filler material 26. An upper surface of the metal frame 40 is disposed at one and the same height position all over.

Thus, the metal frame 40 is airtightly bonded on the metal plate 10 and the ceramic spacers 12a on the ceramic members 12 by the gold-tin brazing filler material 26.

Further, an opening portion 41 is provided in one of side plates 40a of the metal frame 40 at a region where the ceramic member 12 is not disposed, as shown in a right-side region of FIG. 16. A window component 16 is bonded to the opening portion 41 of the metal frame 40.

The window component 16 is formed from a frame portion 16a and a window glass 16b that is hermetically sealed in the frame portion 16a. The frame portion 16a is formed out of Kovar or an iron-nickel alloy. In addition, the window glass 16b is hermetically sealed in the frame portion 16a by a low melting point glass. The frame portion 16a of the window component 16 is bonded to the opening portion 41 of the metal frame 40 by a gold-tin brazing filler material.

In addition, as shown in FIG. 15, leads 30 are bonded to the electrodes 14 disposed on the ceramic members 12 outside the metal frame 40, and the leads 30 extend outward. Front end portions of the electrodes 14 are disposed in a mounting portion S inside the metal frame 40.

As shown in the partially enlarged view of FIG. 15, the metal frame 40 of the electronic component package 1a according to the second embodiment is provided with a welding portion W in which an upper end portion of the metal frame 40 is bent outward due to a bent portion B, in a similar manner to or the same manner as that according to the first embodiment. That is, the metal frame 40 is provided with the side plates 40a, the bent portion B that is connected to the side plates 40a and has a round shape, and the welding portion W that is connected to the bent portion B and to which a lid member 60 can be bonded. The upper end portions of the side plates 40a of the metal frame 40 are bent horizontally toward the outside to thereby form the welding portion W. An upper surface of the welding portion W is a flat surface.

In addition, the bent portion B has a curved round shape with roundness. When a plate thickness of the metal frame 40 is in a range of 0.5 mm to 1 mm, the roundness of the round shape of the bent portion B is set at R 0.5 mm to R 1 mm.

In addition, each of the portions of the metal frame 40 bonded to the ceramic spacers 12a on the ceramic members 12 is erectly provided with a straight shape. A lower surface of a straight-shaped lower end of the portion of the metal frame 40 is bonded to the ceramic spacer 12a by the gold-tin brazing filler material 26.

On the other hand, as shown in FIG. 16, a portion of the metal frame 40 bonded to the metal plate 10 is bent inward into a round shape. A lower surface of a lower end of the portion bent into the round shape is bonded to the metal plate 10 by the gold-tin brazing filler material 26.

In addition, as shown in the partially enlarged view of FIG. 15, a clearance C is provided between an upper surface of the ceramic spacer 12a on each ceramic member 12 and the lower surface of the welding portion W of the metal frame 40 in a similar manner to or the same manner as in the first embodiment. For example, a height of the clearance C is about 1 mm.

In the electronic component package 1a of FIG. 15, as will be described later, a lid member is bonded on the welding portion W of the metal frame 40 by seam welding after an electronic component is mounted in the mounting portion S. On this occasion, the clearance C is provided between each of the ceramic spacers 12a and the welding portion W of the metal frame 40. In addition, the welding portion W of the metal frame 40 is bent due to the bent portion B having the round shape.

Thus, the structure is formed in such a manner that welding pressure during the seam welding is prevented from being easily transmitted to the electrode-including ceramic components 5 and the window component 16. Thus, the welding pressure during the seam welding is reduced.

Further, in a similar manner to or the same manner as in the first embodiment, the welding portion W of the metal frame 40 is set to be thinner in thickness than each of the side plates 40a of the metal frame 40. Thus, the welding pressure during the seam welding can be absorbed by the welding portion W of the metal frame 40 that is thinner in thickness.

Next, a method for manufacturing the metal frame 40 to be used in the electronic component package 1a according to the second embodiment will be described.

Figure 17A:
FIGS. 17A to 17D are sectional views showing a method for manufacturing a metal frame of the electronic component package according to the second embodiment.

First, as shown in FIG. 17A, an iron plate 40x that is a thin plate is pressed in a similar manner to or the same manner as the aforementioned steps of FIG. 7A to FIG. 8A. Thus, a cavity portion Cx is formed. Then, a bottom plate of the cavity portion Cx is punched. As a result, an opening portion 40y is formed.

Figure 17B:
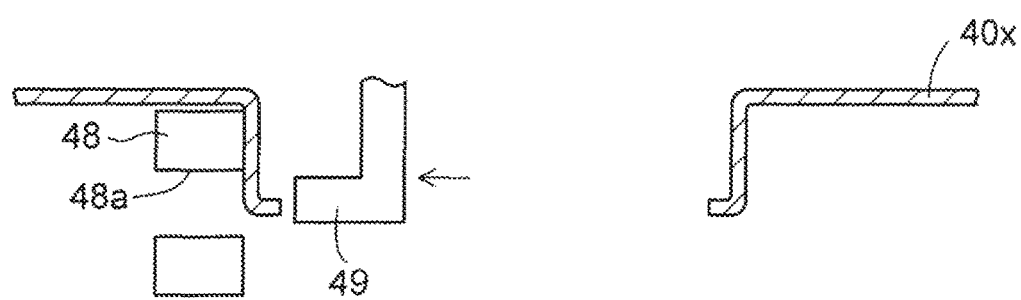
Figure 17C:

Next, as shown in FIG. 17B, one of outer surfaces of opposite side plates 40a of the cavity portion Cx of the iron plate 40x is supported by a die 48. The die 48 is internally provided with an opening portion 48a. Further, a punch 49 that can move horizontally is prepared. A lower portion of the side plate 40a of the cavity portion Cx is punched by the punch 49. Thus, a notch opening portion 40z is formed on a lower side of the side plate 40a of the metal frame 40.

As described above, the notch opening portion 40z of the metal frame 40 is a notch portion into which an electrode-including ceramic component 5 can be fitted.

Figure 17D:

Then, one of the remaining side plates 40a of the cavity portion Cx where the notch opening portion 40x is not formed is punched by a punch (not shown as shown in FIG. 17D. As a result, an opening portion 41 to which a window component 16 can be bonded is formed.

Further, the iron plate 40x surrounding the cavity portion Cx is punched. As a result, each of individual metal frames 40 is obtained. A portion of a flat portion of the iron plate 40x is left like a flange at an upper end of the cavity portion Cx to serve as an annular welding portion W.

Since the welding portion W is made thinner in thickness than each of the side plates 40a, a portion of the iron plate 40x serving as the welding portion W is squashed by pressing at a predetermined stage of the aforementioned step so as to be made thinner.

Thus, the metal frame 40 to be used in the electronic component package 1a according to the second embodiment can be manufactured easily by pressing the iron plate 40x that is a thin plate in a similar manner to or the same manner as that according to the first embodiment. Differently from the metal frame 300 according to the preliminary matter, the metal frame 40 does not use a technique of cutting a metal tube made of a drawn material to increase the cost. Accordingly, the cost can be reduced.

In addition, each of the aforementioned electrode-including ceramic components 5 of FIG. 15 is manufactured as follows. That is, a metalized paste is printed on a lower-side green sheet, and an upper-side green sheet is deposited and crimped thereon. The assembly obtained thus is baked.

Thus, a ceramic member 12 is formed from the lower-side green sheet, electrodes 14 are formed from the metalized paste, and a ceramic spacer 12a is formed from the upper-side green sheet. The ceramic member 12 and the ceramic spacer are formed, for example, out of aluminum oxide. In addition, the electrodes 14 are formed out of tungsten (W), molybdenum (Mo), or the like.

Alternatively, a sintered ceramic spacer 12a may be bonded on a sintered ceramic member 12 and electrodes 14 after the electrodes 14 each including a copper layer/a gold layer etc. are formed on the ceramic member 12 by vapor deposition using a mask etc.

The electronic component package 1a according to the second embodiment is manufactured as follows. That is, the pair of electrode-including ceramic components 5 and the metal frame 40 are aligned with each other and disposed on the metal plate 10 through the gold-tin brazing filler material.

Heat treatment is applied at a temperature of about 300° C. Thus, the metal plate 10 with the electrode-including ceramic components 5, the metal plate 10 with the metal frame 40, and the electrode-including ceramic components 5 with the metal frame 40 are batch-bonded respectively by the gold-tin brazing filler material. On this occasion, the window component 16 is bonded simultaneously to the opening portion 41 of the metal frame 40. In a case where the structure can withstand a temperature of about 800° C., the gold-tin brazing filler material may be replaced by a silver brazing filler material for the aforementioned batch bonding.

Next, a method of constructing an electronic component device using the electronic component package 1a according to the second embodiment will be described.

Figure 18A:
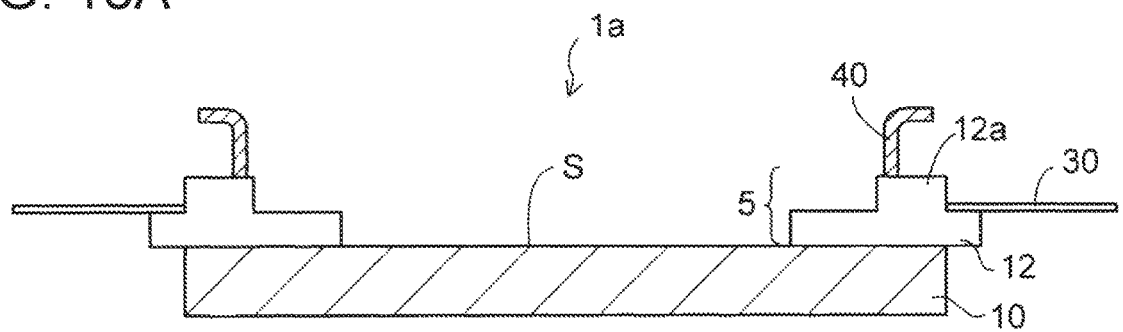
FIGS. 18A to 18C are sectional views showing a method for manufacturing an electronic component device using the electronic component package according to the second embodiment.
Figure 18B:
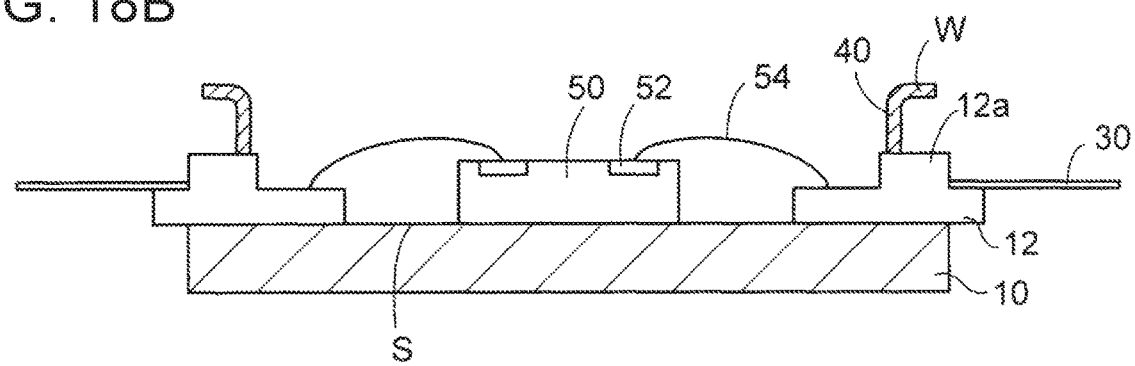

As shown in FIG. 18A, first, the aforementioned electronic component package 1a of FIG. 15 is prepared. As shown in FIG. 18B, a light-emitting element 50 provided with connection terminals 52 on its upper surface side is mounted in the mounting portion S of the electronic component package 1*a*. The light-emitting element 50 is an example of an electronic component.

Further, the connection terminals 152 of the light-emitting element 50 are connected with the electrodes 14 (the partially enlarged view of FIG. 15) on the ceramic members 12 of the electronic component package 1*a* by metal wires 54.

Figure 18C:
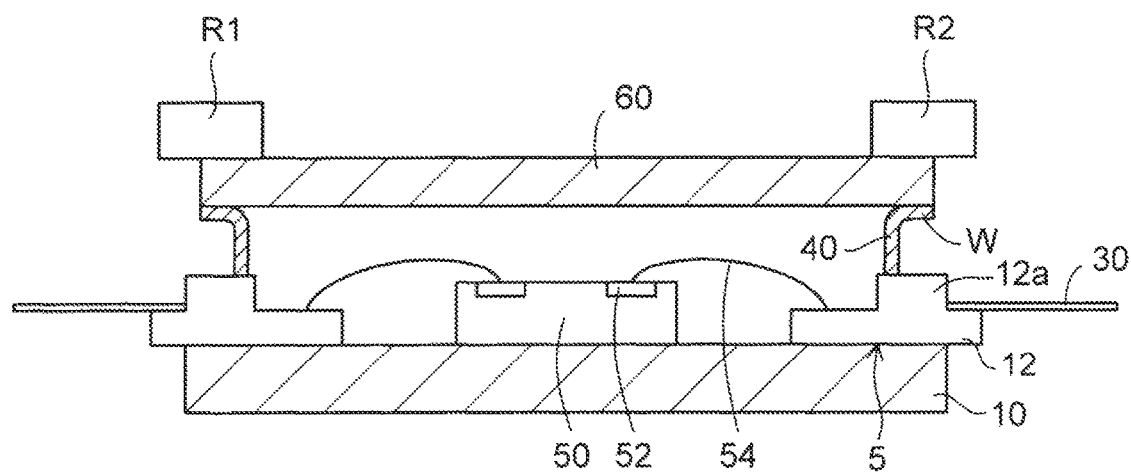

Successively, as shown in FIG. 18C, a lid member 60 is disposed on the welding portion W of the metal frame 40 of the electronic component package 1*a*. In the electronic component package 1*a* according to the second embodiment, the lid member 60 is not provided with any window glass because the window glass 16*b* (FIG. 16) is provided in the side plate 40*a* of the metal frame 40.

Further, by seam welding that has been described above in FIGS. 12A and 12B, a current is made to flow between a pair of roller electrodes R1 and R2 to thereby bond the lid member 60 to the welding portion W of the metal frame 40.

In the electronic component package 1*a* according to the second embodiment, as described above, the clearance C is provided between each of the ceramic spacers 12*a* and the welding portion W of the metal frame 40. In addition, the welding portion W of the metal frame 40 is bent outward due to the bent portion B having the round shape.

Therefore, the structure is formed in such a manner that welding pressure during the seam welding is prevented from being easily transmitted. Thus, stress applied to the electrode-including ceramic components 5 and the window component 16 that is provided in the metal frame 40 is reduced.

Further, the welding portion W of the metal frame 40 is set to be thinner in thickness than each of the side plates 40*a* of the metal frame 40. Thus, the welding pressure during the seam welding can be absorbed by the welding portion W of the metal frame 40 that is thinner in thickness.

Figure 19:
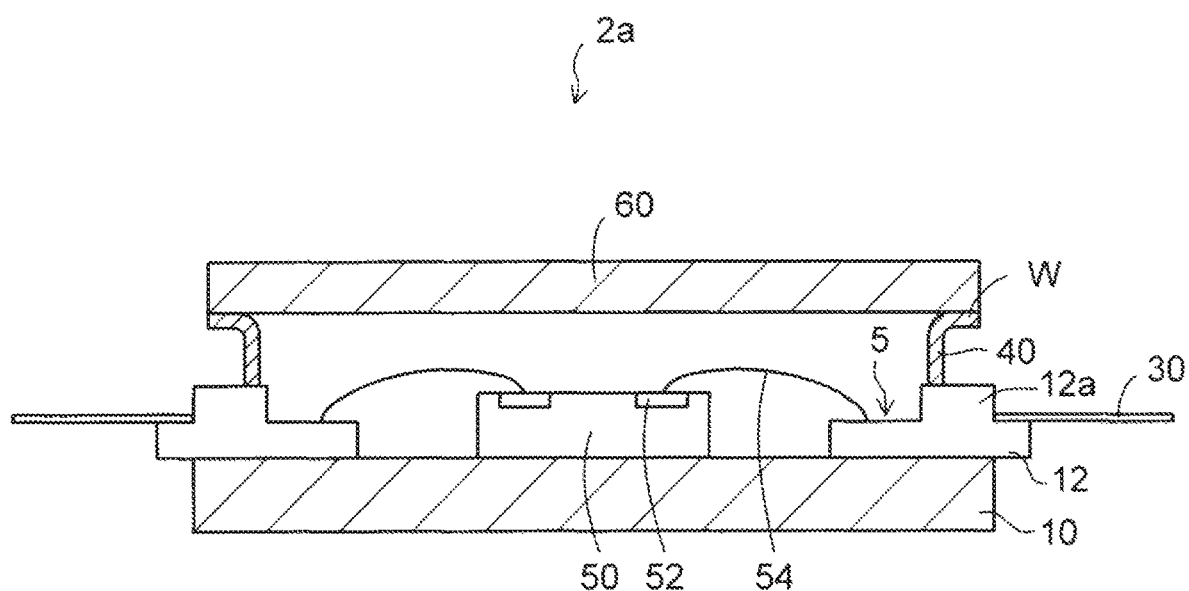
FIG. 19 is a sectional view showing the electronic component device according to the second embodiment.

In the aforementioned manner, an electronic component device 2*a* according to the second embodiment is obtained, as shown in FIG. 19. In the example of FIG. 19, the electronic component device 2*a* is a light-emitting device, and the light-emitting element 50 is an edge light-emitting laser. Light emitted from an edge of the light-emitting element 50 is emitted to the outside through the window glass 16*b* (FIG. 16) provided in the side plate 40*a* of the metal frame 40.

In the electronic component device 2*a* according to the second embodiment, the stress applied during the seam welding is reduced. Accordingly, there is no fear that damage may be given to each of the bonded portions of the electrode-including ceramic components 5 and the window component 16. Consequently, reliability can be improved. In addition, the metal frame 40 can be manufactured by pressing. Accordingly, the cost can be reduced.

As described above, the exemplary embodiment and the modification are described in detail. However, the present invention is not limited to the above-described embodiment and the modification, and various modifications and replacements are applied to the above-described embodiment and the modifications without departing from the scope of claims.

What is claimed is:

1. An electronic component package comprising:
 a metal plate;
 a metal wall that is disposed on the metal plate;
 a metal frame that is disposed on the metal plate so as to be opposed to the metal wall;
 a through hole that is formed in the metal wall;
 an opening hole that is formed in the metal frame so as to be opposed to the through hole; and
 a lead that is hermetically sealed with a sealing portion provided in the through hole, and that is inserted into the opening hole and the through hole;
 wherein the metal frame includes:
 a side plate that is opposed to the metal wall;
 a bent portion that is connected to the side plate and has a round shape; and
 a welding portion that is connected to the bent portion and to which a lid member is to be bonded.

2. An electronic component package comprising:
 a metal plate;
 a ceramic member that is disposed on the metal plate;
 an electrode that is formed on the ceramic member;
 a ceramic spacer that is formed on the electrode; and
 a metal frame that is disposed on the ceramic spacer;
 wherein the metal frame includes:
 a side plate;
 a bent portion that is connected to the side plate and has a round shape; and
 a welding portion that is connected to the bent portion and to which a lid member is to be bonded,
 wherein the welding portion is thinner in thickness than the side plate.

3. The electronic component package according to claim 1, wherein a clearance is provided between the welding portion and the metal wall.

4. The electronic component package according to claim 2, wherein a clearance is provided between the welding portion and the ceramic spacer.

5. The electronic component package according to claim 1, wherein the welding portion is thinner in thickness than the side plate.

6. An electronic component device comprising:
 an electronic component;
 an electronic component package that is configured to mount the electronic component thereon; and
 a lid member that is bonded to the electronic component package, wherein the electronic component package comprises:
 a metal plate on which the electronic component is disposed;
 a metal wall that is disposed on the metal plate;
 a metal frame that is disposed on the metal plate so as to be opposed to the metal wall;
 a through hole that is formed in the metal wall;
 an opening hole that is formed in the metal frame so as to be opposed to the through hole; and
 a lead that is hermetically sealed with a sealing portion provided in the through hole, and that is inserted into the opening hole and the through hole, and
 wherein the metal frame includes:
 a side plate that is opposed to the metal wall;
 a bent portion that is connected to the side plate and has a round shape; and
 a welding portion that is connected to the bent portion and to which the lid member is bonded.

7. An electronic component device comprising:
 an electronic component;
 an electronic component package that is configured to mount the electronic component thereon; and
 a lid member that is bonded to the electronic component package, wherein the electronic component package comprises:
 a metal plate on which the electronic component is disposed;
 a ceramic member that is disposed on the metal plate;
 an electrode that is formed on the ceramic member;

a ceramic spacer that is formed on the electrode; and
a metal frame that is disposed on the ceramic spacer, and wherein the metal frame includes:
a side plate;
a bent portion that is connected to the side plate and has a round shape; and
a welding portion that is connected to the bent portion and to which the lid member is bonded,
wherein the welding portion is thinner in thickness than the side plate.

* * * * *